US007058908B2

(12) United States Patent
Keller et al.

(10) Patent No.: US 7,058,908 B2
(45) Date of Patent: Jun. 6, 2006

(54) SYSTEMS AND METHODS UTILIZING FAST ANALYSIS INFORMATION DURING DETAILED ANALYSIS OF A CIRCUIT DESIGN (75) Inventors: S. Brandon Keller, Evans, CO (US); Gregory Dennis Rogers, Fort Collins, CO (US); George Harold Robbert, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 316 days.

(21) Appl. No.: 10/647,687

(22) Filed: Aug. 25, 2003

(65) Prior Publication Data

US 2005/0050486 A1    Mar. 3, 2005

(51) Int. Cl.
*G06F 9/45* (2006.01)
*G06F 17/50* (2006.01)

(52) U.S. Cl. ............................... 716/4; 716/5
(58) Field of Classification Search ................. 716/1–6
See application file for complete search history.

(56) References Cited

U.S. PATENT DOCUMENTS

| 5,249,133 | A |   | 9/1993  | Batra          |       |
|-----------|---|---|---------|----------------|-------|
| 5,301,318 | A |   | 4/1994  | Mittal         |       |
| 5,668,732 | A |   | 9/1997  | Khouja et al.  |       |
| 5,673,420 | A |   | 9/1997  | Reyes et al.   |       |
| 5,682,320 | A |   | 10/1997 | Khouja et al.  |       |
| 5,696,694 | A |   | 12/1997 | Khouja et al.  |       |
| 5,812,416 | A |   | 9/1998  | Gupte et al.   |       |
| 5,825,660 | A |   | 10/1998 | Cagan et al.   |       |
| 5,831,869 | A | * | 11/1998 | Ellis et al.   | 716/6 |
| 5,838,579 | A |   | 11/1998 | Olson et al.   |       |
| 5,903,476 | A |   | 5/1999  | Mauskar et al. |       |
| 5,946,218 | A |   | 8/1999  | Taylor et al.  |       |
| 5,949,691 | A |   | 9/1999  | Kurosaka et al.|       |
| 6,028,991 | A |   | 2/2000  | Akashi         |       |
| 6,075,932 | A |   | 6/2000  | Khouja et al.  |       |
| 6,185,722 | B1|   | 2/2001  | Darden et al.  |       |
| 6,230,299 | B1|   | 5/2001  | McSherry et al.|       |
| 6,272,671 | B1|   | 8/2001  | Fakhry         |       |
| 6,308,304 | B1| * | 10/2001 | Devgan et al.  | 716/5 |
| 6,330,703 | B1|   | 12/2001 | Saito et al.   |       |

(Continued)

FOREIGN PATENT DOCUMENTS

JP            07334532 A    12/1995

OTHER PUBLICATIONS

Blaquiere, Y. et al. "Fast Timing Analysis of VLSI Circuits: a Dynamic and Hierachical Approach" IEEE International Symposium on Circuits and Systems, Jun. 11-14, 1991, pp. 2398-2402.*

(Continued)

*Primary Examiner*—Stacy A. Whitmore
*Assistant Examiner*—Magid Y. Dimyan (57) ABSTRACT Systems, methods, software products utilize fast analysis information during detailed analysis of a circuit design. One or more design blocks of the circuit design are electronically analyzed to determine fast analysis results based upon assumptions of ported signal nets of each one of the design blocks. Next, it is determined whether hierarchical signal net connectivity of block instances of the design blocks and the assumptions match. If the hierarchical signal net connectivity matches the assumptions, the fast analysis results are utilized to generate detailed analysis results. If the hierarchical signal net connectivity does not match the assumptions, the one or more blocks in the hierarchical signal net connection are electronically analyzed to generate detailed analysis results.

20 Claims, 9 Drawing Sheets

U.S. PATENT DOCUMENTS

| | | | |
|---|---|---|---|
| 6,345,379 | B1 | 2/2002 | Khouja et al. |
| 6,363,516 | B1 | 3/2002 | Cano et al. |
| 6,378,123 | B1 | 4/2002 | Dupenloup |
| 6,480,987 | B1 | 11/2002 | McBride |
| 6,490,717 | B1 | 12/2002 | Pederson et al. |
| 6,493,864 | B1 | 12/2002 | Liu |
| 6,523,149 | B1* | 2/2003 | Mehrotra et al. ............... 716/4 |
| 6,526,562 | B1 | 2/2003 | Haddad et al. |
| 6,529,861 | B1 | 3/2003 | Patra et al. |
| 6,531,923 | B1 | 3/2003 | Burns |
| 6,587,999 | B1 | 7/2003 | Chen et al. |
| 6,598,211 | B1 | 7/2003 | Zachariah et al. |
| 6,751,782 | B1 | 6/2004 | Levin et al. |
| 6,772,404 | B1 | 8/2004 | Tanaka |
| 6,801,884 | B1 | 10/2004 | Ferreri et al. |
| 6,807,520 | B1 | 10/2004 | Zhou et al. |
| 6,836,877 | B1 | 12/2004 | Dupenloup |
| 6,931,613 | B1 | 8/2005 | Kauth et al. |
| 2002/0002701 | A1* | 1/2002 | Usami et al. ................... 716/8 |
| 2002/0010901 | A1* | 1/2002 | Otaguro ........................ 716/12 |
| 2002/0023255 | A1* | 2/2002 | Karniewicz ................... 716/17 |
| 2002/0144219 | A1 | 10/2002 | Zachariah et al. |
| 2003/0051222 | A1 | 3/2003 | Williams et al. |
| 2003/0200519 | A1 | 10/2003 | Argyres |
| 2003/0208721 | A1 | 11/2003 | Regnier |
| 2003/0221173 | A1 | 11/2003 | Fisher |
| 2003/0237067 | A1* | 12/2003 | Mielke et al. .................. 716/6 |
| 2004/0044972 | A1* | 3/2004 | Rohrbaugh et al. ............. 716/2 |
| 2004/0078767 | A1* | 4/2004 | Burks et al. .................... 716/8 |

OTHER PUBLICATIONS

Keller, S. Brandon; Rogers, Dennis R.; Lelm, Charles A.; U.S. Appl. No. 10/706,682, Entitled: Method And Program Product For Determining Nets Requiring Detailed Electromigration And Self Heating Analysis In A Digital Integrated Circuit; Filed Nov. 12, 2003.

Keller, S. Brandon; Rogers, Dennis R.; Lelm, Charles A.; U.S. Appl. No. 10/706,698, Entitled: Method And Program Product For Performing Self-Heating Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,376, Entitled: Method And Program For Visual Display and One-Click Repair Of Electromigration And Self Heating Design-Rule Violations In A Digital Integrated Circuit Layout Database; Filed Nov. 12, 2003.

Keller, S. Brandon; Rogers, Dennis R.; Lelm, Charles A.; U.S. Appl. No. 10/706,501, Entitled: Method And Program Product For Performing Electromigration Analysis In A Digital Integrated Circuit By Converting A Netlist To A DC Model And Performing DC Analysis Of The DC Model; Filed Nov. 12, 2003.

Keller, S. Brandon; Rogers, Dennis R.; Lelm, Charles A.; U.S. Appl. No. 10/706,526, Entitled: Method And Program Product For Performing A Worst Case Electromigration And Self Heating Analysis In A Digital Integrated Circuit With Worst-Case Superposition Of Partial Currents; Filed Nov. 12, 2003.

Keller, S. Brandon; Rogers, Dennis R.; Lelm, Charles A.; U.S. Appl. No. 10/706,692, Entitled: Method And Program Product For Performing Electromigration Analysis In A Digital Integrated Circuit Through A Single Cycle Transient Simulation; Filed Nov. 12, 2003.

Keller, S. Brandon; Rogers, Dennis R.; Lelm, Charles A.; U.S. Appl. No. 10/706,508, Entitled: Method And Program Product For Performing Self-Heating Analysis In A Digital Integrated Circuit Layout Database by Substituting Resistive Models For Active Devices; Filed Nov. 12, 2003.

Keller, S. Brandon; Rogers, Dennis R.; Robberts, George H.; U.S. Patent Application filed under EV210655516US; Entitled: Method And Program Product For Determining Worst Case Currents In A Digital Integrated Circuit Through Worst-Case Superposition Of Partial Currents; Filed Jan. 30, 2004.

Keller, S. Brandon; Rogers, Dennis R.; Robberts, George H.; U.S. Patent Application filed under EV210655564US; Entitled: Systems And Methods For Re-Using Circuit Design Analysis Results; Filed Jan. 30, 2004.

Keller, S. Brandon; Rogers, Dennis R.; Robberts, George H.; U.S. Patent Application filed under EV210655581US; Entitled: System And Method For Determining Detail Of Analysis In A Circuit Design; Filed Jan. 30, 2004.

Keller, S. Brandon; Rogers, Dennis R.; Robberts, George H.; U.S. Patent Application filed under EV210655595US; Entitled: Systems And Methods That Identify Equivalent Instantiation-Specific Configuration Information For Analysis Tools; Filed Jan. 30, 2004.

Keller, S. Brandon; Rogers, Dennis R.; Robberts, George H. & Stevens, Scott Alan; U.S. Patent Application filed under EV210655520US; Entitled: System And Method To Limit Analyzed Current Flow In A Circuit Design; Filed Jan. 30, 2004.

Keller, S. Brandon; Rogers, Dennis R.; Robberts, George H.; U.S. Patent Application filed under EV210655533US; Entitled: System And Method For Processing Configuration Information; Filed Jan. 30, 2004.

Keller, S. Brandon; Rogers, Dennis R.; Robberts, George H.; U.S. Patent Application filed under EV210655555US; Entitled: System And Method For Balancing Run-Time And Result Accuracy In A Circuit Design Analysis Tool; Filed Jan. 30, 2004.

Keller, S. Brandon; Rogers, Dennis R.; Robberts, George H.; U.S. Patent Application filed under EV210655578US; Entitled: System And Method For Indicating Logic State Combinations Used During Circuit Design Analysis; Filed Jan. 30, 2004.

Keller, S. Brandon; Rogers, Dennis R.; Robberts, George H.; U.S. Patent Application filed under EV210655547US; Entitled: System And Method For Determining Control Signal Combinations For Use During Simulation Of A Stage Of A Circuit Design; Filed Jan. 30, 2004.

* cited by examiner

SYSTEMS AND METHODS UTILIZING FAST ANALYSIS INFORMATION DURING DETAILED ANALYSIS OF A CIRCUIT DESIGN

RELATED APPLICATIONS

The present document contains material related to the material of copending, cofiled, U.S. patent application Ser. No. 10/647,597, entitled System And Method For Determining Wire Capacitance For A VLSI Circuit; U.S. patent application Ser. No. 10/647,595, entitled System And Method For Determining Applicable Configuration Information For Use In Analysis Of A Computer Aided Design; U.S. patent application Ser. No. 10/647,594, entitled Systems And Methods For Determining Activity Factors Of A Circuit Design; U.S. patent application Ser. No. 10/647,768, entitled System And Method For Determining A Highest Level Signal Name In A Hierarchical VLSI Design; U.S. patent application Ser. No. 10/647,606, entitled System And Method For Determining Connectivity Of Nets In A Hierarchical Circuit Design; U.S. patent application Ser. No. 10/647,596, entitled System And Method Analyzing Design Elements In Computer Aided Design Tools; U.S. patent application Ser. No. 10/647,608, entitled System And Method For Determining Unmatched Design Elements In A Computer-Automated Design; U.S. patent application Ser. No. 10/647,598, entitled Computer Aided Design Systems And Methods With Reduced Memory Utilization; U.S. patent application Ser. No. 10/647,688, entitled System And Method For Iteratively Traversing A Hierarchical Circuit Design; U.S. patent application Ser. No. 10/647,769, entitled Systems And Methods For Establishing Data Model Consistency Of Computer Aided Design Tools; U.S. patent application Ser. No. 10/647,607, entitled Systems And Methods For Identifying Data Sources Associated With A Circuit Design, and U.S. patent application Ser. No. 10/647,605, entitled Systems And Methods For Performing Circuit Analysis On A Circuit Design, the disclosures of which are hereby incorporated herein by reference.

BACKGROUND

An electronic computer aided design ("E-CAD") package is utilized to construct a circuit design. For example, the circuit design may be a Very Large Scale Integration ("VLSI") circuit design. The circuit design consists of a netlist that identifies electronic design components and their interconnectivity within the circuit design. The design is constructed from design blocks (also known as cells), each providing specific functionality to the circuit design. Such design blocks may be re-used with the circuit design, or in other circuit designs. Designs blocks may also be constructed from electronic design elements and other design blocks. Typically, the circuit design is constructed from design blocks in a hierarchical manner, and may utilize design blocks one or more times. Each use of a design block is called an "instance".

A design engineer may use the E-CAD tool to analyze the circuit design during development. One E-CAD tool provides (a) a fast analysis tool that processes blocks of the design without tracing hierarchical information, resulting in a low level of detail but with reduced analysis time, and (b) a detailed analysis that traces nets of blocks using hierarchical information, resulting in a high level of detail but with increased analysis time. In certain situations, the fast analysis tool may not provide the design engineer with sufficient information to make design choices; in such situations, the design engineer utilizes the detailed analysis. However, when a circuit design includes billions of nets in a netlist of the design, detailed analysis may result in hours or even days of processing time. Such delay causes inefficiency, adding cost to the design process and potentially delaying technological advancement.

SUMMARY OF THE INVENTION

In one embodiment, a method utilizes fast analysis information during detailed analysis of a circuit design. One or more design blocks of the circuit design are electronically analyzed to determine fast analysis results based upon assumptions of ported signal nets of each one of the design blocks. Next, it is determined whether hierarchical signal net connectivity of block instances of the design blocks and the assumptions match. If the hierarchical signal net connectivity matches the assumptions, the fast analysis results are utilized to generate detailed analysis results. If the hierarchical signal net connectivity does not match the assumptions, the one or more blocks in the hierarchical signal net connection are electronically analyzed to generate detailed analysis results.

In one embodiment, a system utilizes fast analysis information during detailed analysis of a circuit design. A fast analysis tool electronically analyzes one or more design blocks of the circuit design to determine fast analysis results based upon assumptions of ported signal nets of each one of the design blocks. A detailed analysis tool determines whether hierarchical signal net connectivity of block instances of the design blocks matches the assumptions. The detailed analysis tool utilizes the fast analysis results to generate detailed analysis results when the hierarchical connectivity matches the assumptions, and electronically analyzes instances of the one or more design blocks to generate detailed analysis results when the hierarchical connectivity does not match the assumptions.

In one embodiment, a system utilizes fast analysis information during detailed analysis of a circuit design, including: means for electronically analyzing one or more design blocks of the circuit design to determine fast analysis results based upon assumptions of ported signal nets of each one of the design blocks; means for determining whether hierarchical signal net connectivity of block instances of the design blocks matches the assumptions; means for utilizing the fast analysis results to generate detailed analysis results when the hierarchical signal net connectivity matches the assumptions; and means for electronically analyzing the one or more blocks to generate detailed analysis results when the hierarchical signal net connectivity does not match the assumptions.

In one embodiment, a software product has instructions, stored on computer-readable media, wherein the instructions, when executed by a computer, perform steps for utilizing fast analysis information during detailed analysis of a circuit design, including: instructions for electronically analyzing one or more design blocks of the circuit design to determine fast analysis results based upon assumptions about ported signal nets of each one of the design blocks; instructions for determining whether hierarchical signal net connectivity of block instances of the design blocks matches the assumptions; instructions for utilizing the fast analysis results to generate detailed analysis results when the hierarchical signal net connectivity matches the assumptions; and instructions for electronically analyzing the one or more blocks to generate detailed analysis results when the hierarchical signal net connectivity does not match the assumptions.

DETAILED DESCRIPTION OF THE FIGURES

A net is a single electrical path in a circuit that has the same electrical characteristics at all of its points. Any collection of wires that carries the same signal between circuit components is a net. If the components allow the signal to pass through unaltered (as in the case of a terminal), then the net continues on subsequently connected wires. If, however, the component modifies the signal (as in the case of a transistor or logic gate), then the net terminates at that component and a new net begins on the other side. Connectivity in a VLSI circuit design is typically specified using a netlist, which indicates the specific nets that interconnect the various circuit components.

A net may be considered to be divided into net 'pieces', each of which is part of a 'highest level signal name' ("HLSN"). A HLSN is the unique signal name that identifies a collection of local nets or 'hierarchical net pieces', which are the small pieces of wire (nets) in each hierarchical block of a circuit design.

A significant characteristic of VLSI and other types of circuit design is a reliance on hierarchical description. A primary reason for using hierarchical description is to hide the vast amount of detail in a design. By reducing the distracting detail to a single object that is lower in the hierarchy, one can greatly simplify many E-CAD operations. For example, simulation, verification, design-rule checking, and layout constraints can all benefit from hierarchical representation, which makes them more computationally tractable. Since many circuits are too complicated to be easily considered in their totality, a complete design is often viewed as a collection of component aggregates that are further divided into sub-aggregates in a recursive and hierarchical manner. In circuit designs, these aggregates are commonly referred to as blocks (or cells). The use of a block at a given level of hierarchy is called an 'instance'.

Figure 1:
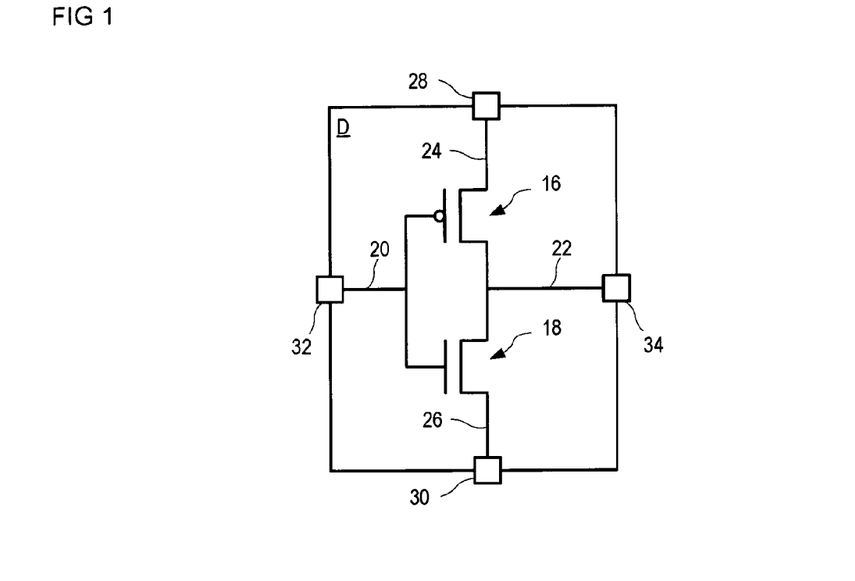
FIG. 1 is a schematic illustrating one exemplary design block.

FIG. 1 is a schematic illustrating one exemplary design block D. Design block D has four ports 28, 30, 32 and 34 and, in this example, includes a p-type field-effect transistor ("FET") 16 and an n-type FET 18 connected to form an inverter. Design block D also has four signal nets 20, 22, 24 and 26: signal net 20 connects to port 32; signal net 22 connects to port 34; signal net 24 connects to port 28; and signal net 26 connects to port 30. Design block D may be used within other design blocks to provide the inverter functionality, thereby instantiating design block D one or more times within a circuit design.

Figure 2:
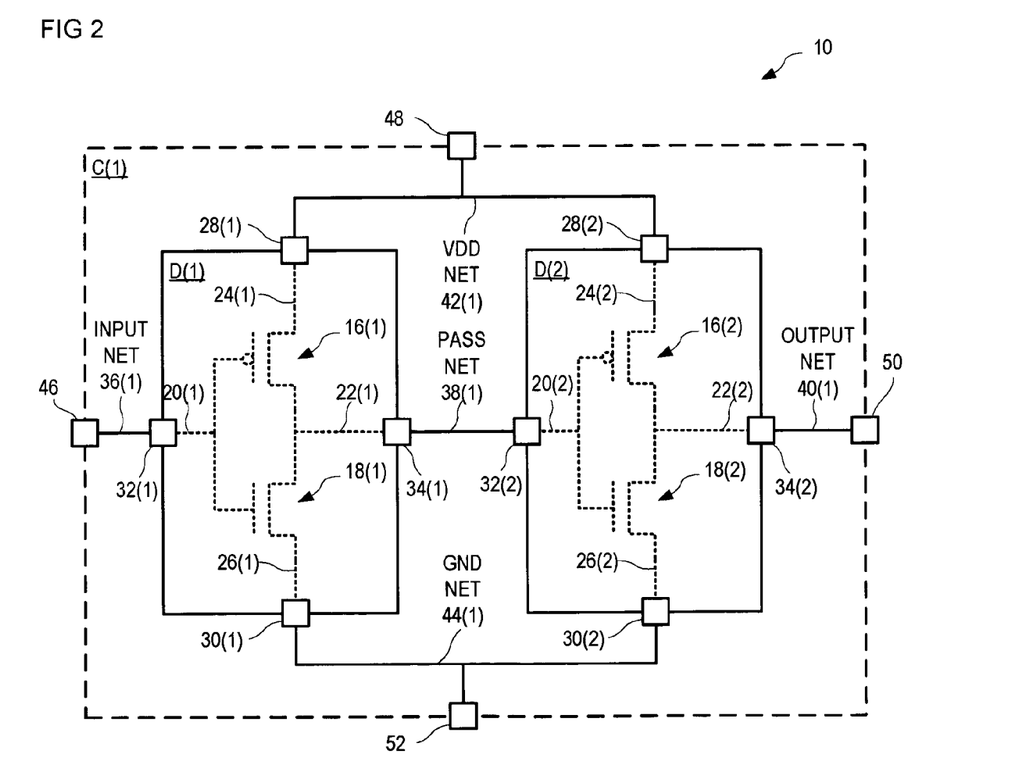
FIG. 2 shows one exemplary hierarchical circuit design illustrating exemplary nomenclature used in analysis of a circuit design.

FIG. 2 illustratively shows one hierarchical circuit design 10. Circuit design 10 has a block instance C(1) that includes two block instances D(1) and D(2) of design block D, FIG. 1. Block instance D(1) is shown with FETs 16(1) and 18(1), ports 28(1), 30(1), 32(1) and 34(1), and signal nets 20(1), 22(1), 24(1) and 26(1). Block instance D(2) is similarly shown with FETs 16(2) and 18(2), signal nets 20(2), 22(2), 24(2), and 26(2), and ports 28(2), 30(2), 32(2), and 34(2).

To illustrate exemplary nomenclature used in analyzing block instance C(1), block instance C(1) is shown with five signal nets: input net 36(1), pass net 38(1), output net 40(1), VDD net 42(1) and GND net 44(1). Signal nets 20(1) and 36(1) connect to port 32(1), forming hierarchical signal net pieces identified by HLSN "input net". Signal nets 22(1), 38(1) and 20(2) interconnect by ports 34(1) and 32(2) and form hierarchical signal net pieces identified by HLSN "pass net". Signal nets 24(1), 42(1) and 24(2) interconnect by ports 28(1) and 28(2) and form hierarchical signal net pieces identified by HLSN "VDD net". Signal nets 26(1), 44(1) and 26(2) interconnect by ports 30(1) and 30(2) and form hierarchical signal net pieces identified by HLSN "GND net". Signal nets 22(2) and 40(1) connect to port 34(2) and form hierarchical signal net pieces identified by HLSN "output net". Block instance C(1) further includes ports 46, 48, 50 and 52 that connect internal signal nets 36(1), 42(1), 40(1) and 44(1) to signal nets external to block instance C(1).

Figure 3:
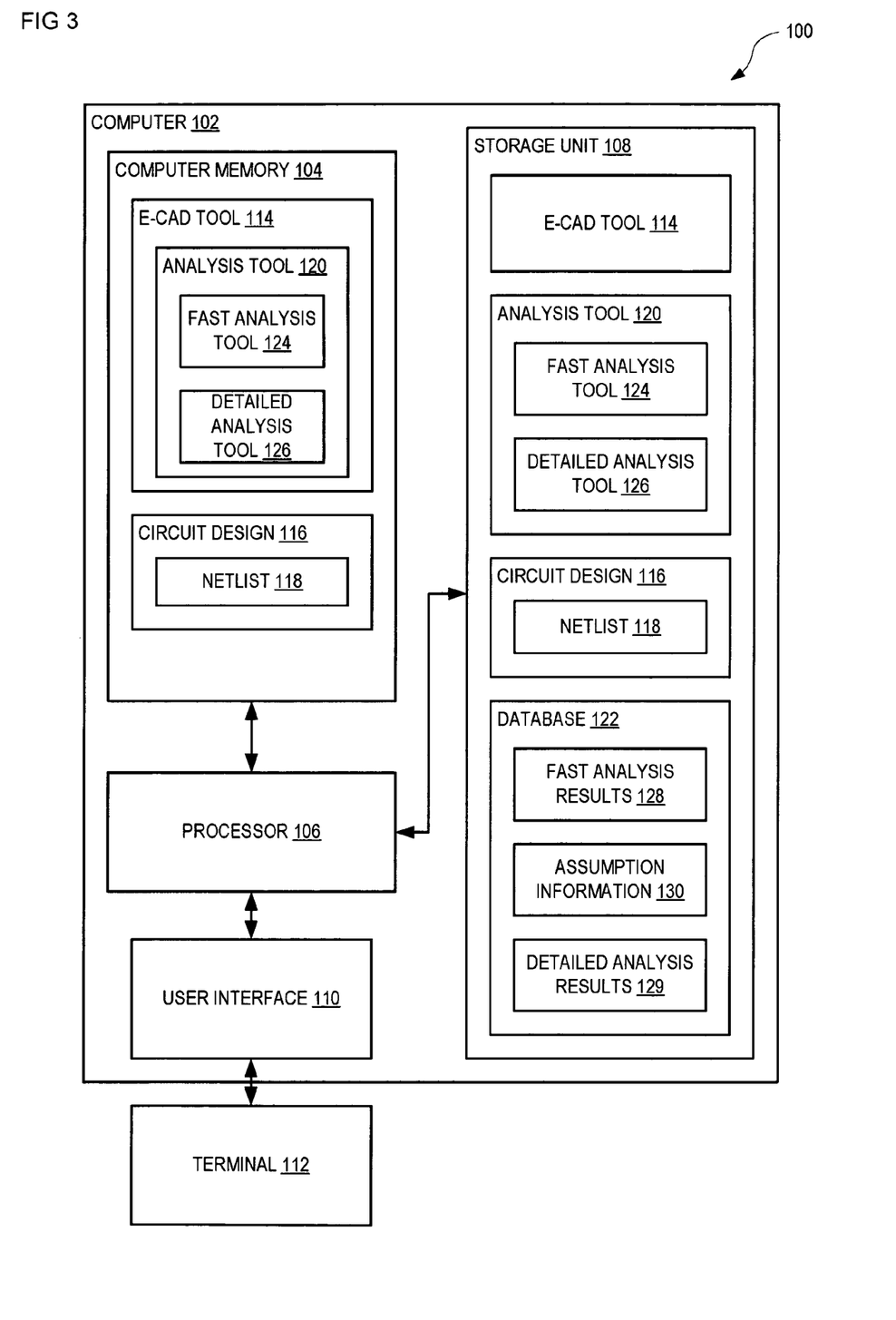
FIG. 3 shows one system utilizing fast analysis information during detailed analysis of a circuit design.

FIG. 3 is a block diagram illustrating one system 100 for utilizing fast analysis information during detailed analysis of a circuit design. System 100 has a computer 102 with a computer memory 104, a processor 106, a storage unit 108 and a user interface 110. Storage unit 108 may for example be a disk drive for storing programs and data of computer 102. Storage unit 108 is illustratively shown storing an E-CAD tool 114, an analysis tool 120, a circuit design 116 and a database 122. Circuit design 116 is, for example, a circuit design created by E-CAD tool 114. Circuit design 116 includes a netlist 118 that defines nets interconnecting various design elements of circuit design 116.

Processor 106 loads E-CAD tool 114 from storage unit 108 into computer memory 104 such that E-CAD tool 114 is executable by processor 106. E-CAD tool 114 may in turn request that processor 106 load analysis tool 120 and circuit design 116 from storage unit 108 into computer memory 104. Once loaded into computer memory 104, a design engineer operates E-CAD tool 114 to process and analyze circuit design 116. Analysis tool 120 includes a fast analysis tool 124 and a detailed analysis tool 126. As described below, database 122 stores fast analysis results 128, assumption information 130 and detailed analysis results 129. Fast analysis tool 124 generates fast analysis results 128 and assumption information 130 during fast analysis of circuit design 116. Detailed analysis tool 126 utilizes fast analysis results 128 and assumption information 130 to generate detailed analysis results 129 during detailed analysis of circuit design 116.

By way of example, user interface 110 connects to a terminal 112 (e.g., a keyboard), external to computer 102. Through terminal 112 and user interface 110, the design engineer interacts with E-CAD tool 114 and analysis tool 120. In one example, the design engineer instructs E-CAD tool 114 to analyze circuit design 116 using analysis tool 120 (and, for example, fast analysis tool 124 and/or detailed analysis tool 126). At any one time, analysis tool 120 is thus operable to perform a fast analysis of circuit design 116 using fast analysis tool 124, or to perform a detailed analysis of circuit design 116 using detailed analysis tool 126, as selected by the design engineer at user interface 110.

Figure 4:
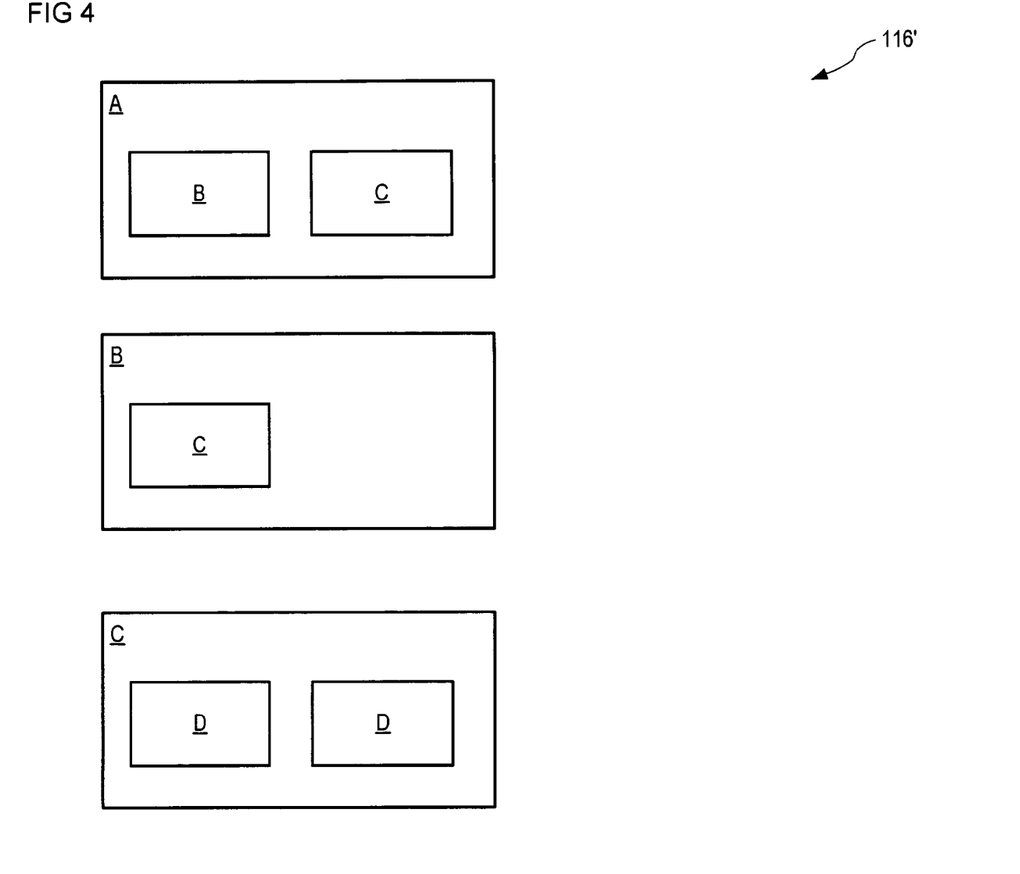
FIG. 4 is a block diagram illustrating hierarchical design blocks.
Figure 7:
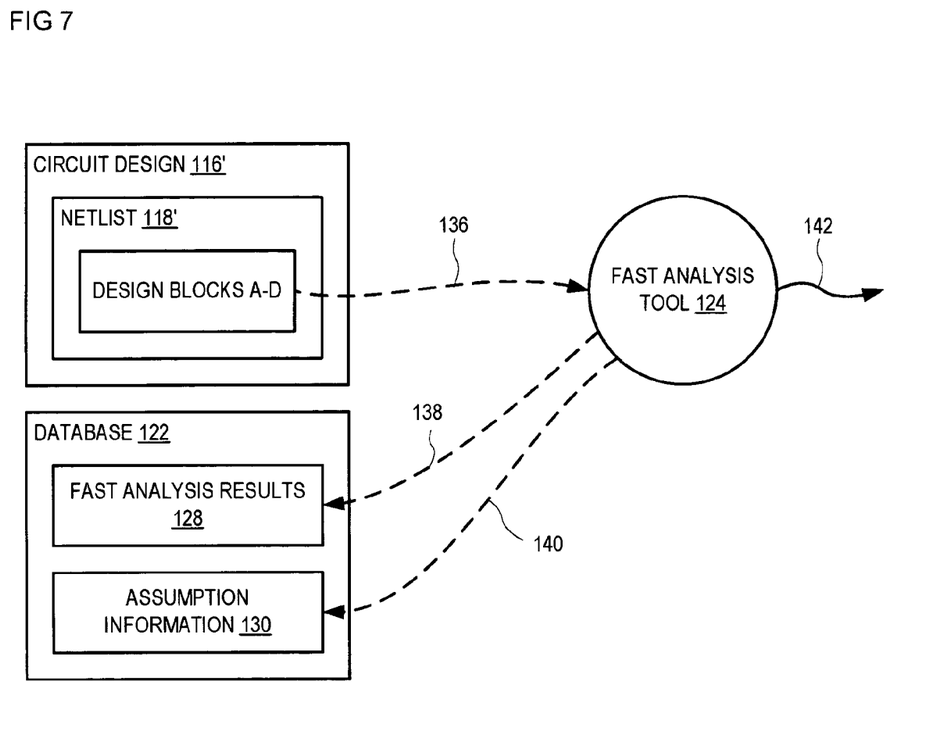
FIG. 7 is a block diagram illustrating exemplary data flow during fast analysis of a circuit design to produce fast analysis results and assumption information by a fast analysis tool.
Figure 8:
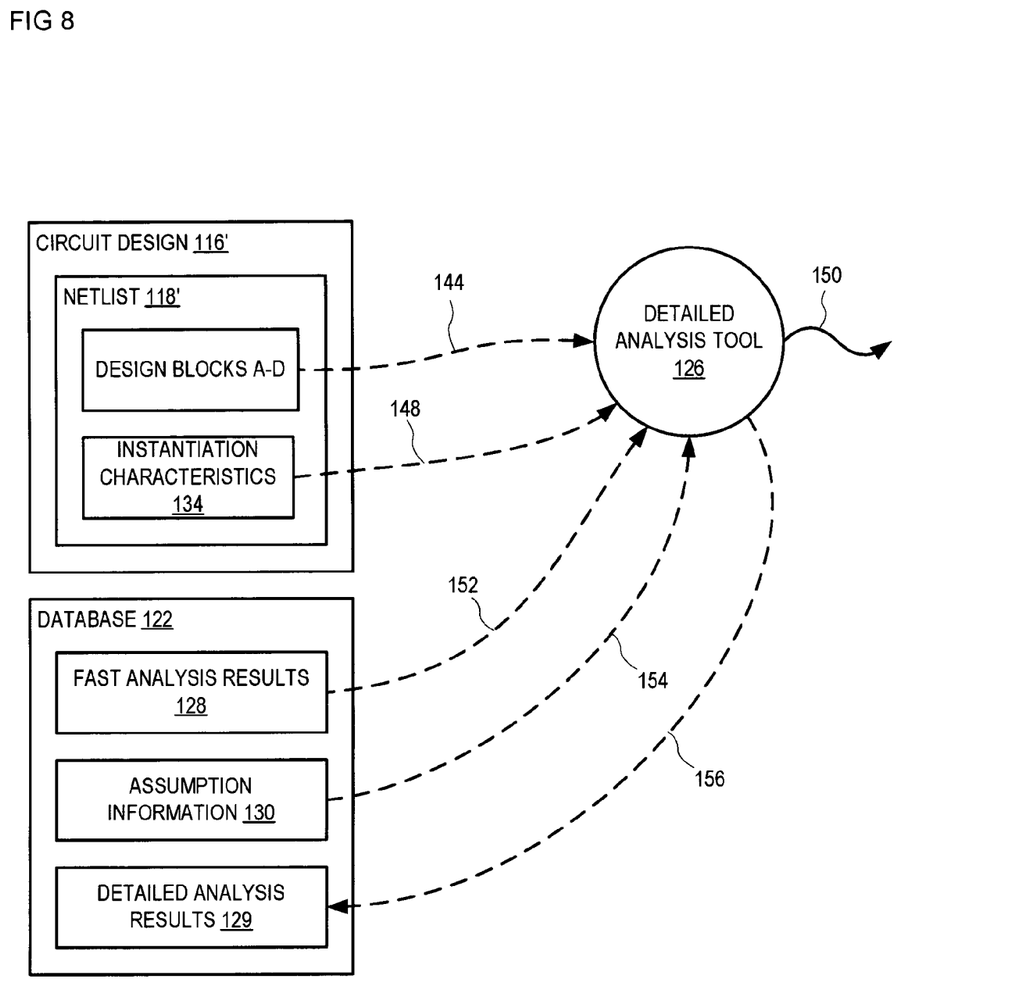
FIG. 8 is a block diagram illustrating exemplary data flow during detailed analysis of a circuit design by a detailed analysis tool utilizing the fast analysis results and assumption information of FIG. 7.

An exemplary circuit design 116' with four design blocks A–D is now discussed in connection with FIG. 4, FIG. 5 and FIG. 6. FIG. 7 then illustrates one process for generating fast analysis information of circuit design 116'; and FIG. 8 illustrates one process for utilizing the fast analysis information during detailed analysis of circuit design 116'. More particularly, the four design blocks A, B, C and D of FIG. 4 illustrate a hierarchical circuit design 116', which may for example represent circuit design 116 of FIG. 3. Design block A includes design blocks B and C; design block B includes design block C; and design block C twice includes design block D of FIG. 1. Design block D does not incorporate other design blocks. Design elements are not shown within design blocks A, B, C and D for clarity of illustration. A design engineer defines design blocks A–D prior to instantiation within circuit design 116'.

Figure 5:
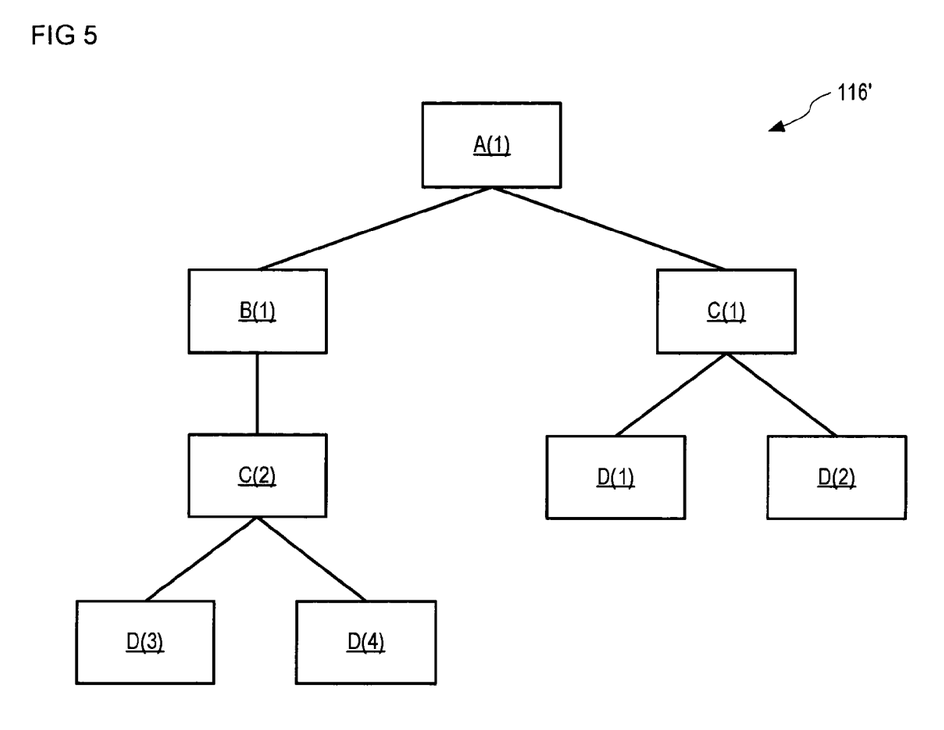
FIG. 5 is a block diagram illustrating hierarchical instantiation of the design blocks of FIG. 4.

FIG. 5 is a block diagram illustrating exemplary hierarchical instances of design blocks A, B, C and D of circuit design 116'. As shown, design block A is the 'top level block' of circuit design 116', and is instantiated in FIG. 5 as block instance A(1), indicating that it is the first instance of block A. As design block A includes design blocks B and C, design blocks B and C are instantiated as block instances B(1) and C(1), as shown. Design block B includes design block C; thus a second instantiation of design block C is shown and identified as block instance C(2). Design block C twice includes design block D; thus first and second instantiations of design block D are shown and identified as block instances D(1) and D(2), relative to block instance C1. Third and fourth instantiations of design block D are shown as block instances D(3) and D(4), relative to block instance C(2).

Figure 6:
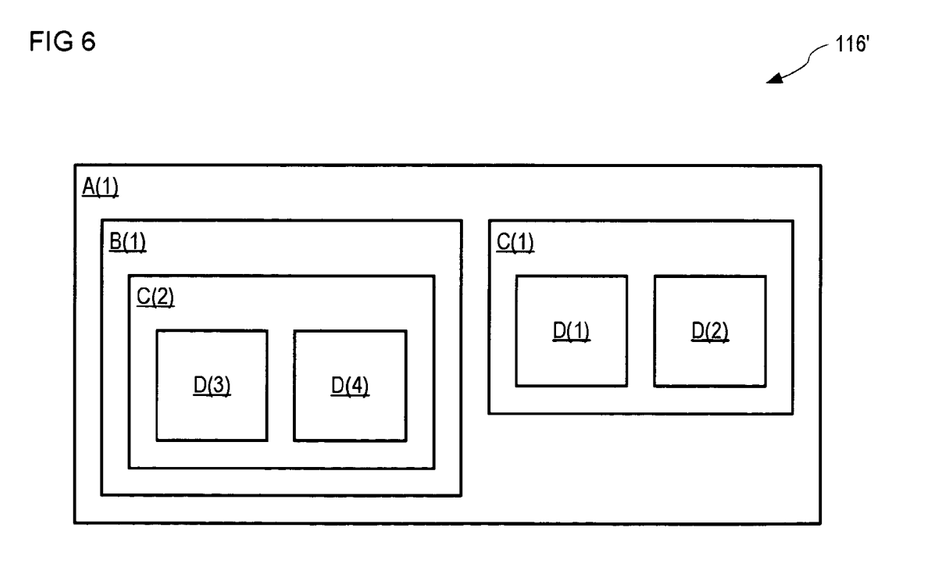
FIG. 6 is a block diagram illustrating one layout view of the instantiated blocks of FIG. 5.

FIG. 6 illustrates how the instances of design blocks A–D may exist in a layout view.

Circuit design 116' thus has four design blocks A, B, C and D, each instantiated one or more times, totaling eight instantiations A(1), B(1), C(1), C(2), D(1), D(2), D(3) and D(4). In one illustrated use of system 100, FIG. 3, the design engineer instructs fast analysis tool 124 to perform circuit analysis on one or more selected blocks (e.g. design blocks A, B, C and/or D) of circuit design 116'to generate fast analysis information. As described in more detail below, the design engineer then instructs detailed analysis tool 126 to perform detailed circuit analysis on one or more selected blocks of circuit design 116' to generate detailed analysis results.

FIG. 7 is a block diagram illustrating exemplary data flow during fast analysis of circuit design 116' to produce fast analysis results 128 and assumption information 130 by fast analysis tool 124. In one embodiment, fast analysis tool 124 reads and analyzes one or more selected design blocks A–D of circuit design 116', via data path 136, to produce fast analysis results 128 and assumption information 130. Fast analysis tool 124 stores fast analysis results 128 in database 122, via data path 138, and assumption information 130 in database 122 via data path 140. Fast analysis tool 124 optionally outputs fast analysis results 128 via data path 142; for example fast analysis results 128 may be output via data path 142 to a printing device or to other functionality of system 100, FIG. 3. In one operational example, fast analysis tool 124 analyses design blocks A–D of circuit design 116' to determine FET leakage current for circuit design 116'.

More particularly, fast analysis tool 124 analyses each selected design block independently, without tracing hierarchical signal net connections external to the design block. During analysis of design block D, FIG. 1, fast analysis tool 124 utilizes assumptions, for example, to determine FET leakage currents. To illustrate these assumptions, consider design block D, where signal net 20 connects gate terminals of FETs 16 and 18 to port 32. In this example, fast analysis tool 124 "assumes" that port 32 (and hence "ported" signal net 20) connects to another signal net (as opposed to a power net) external to block D. Fast analysis tool 124 also "assumes" that signal net 24, which connects the drain terminal of FET 16 to port 28, connects to a FET of the opposite type (e.g., an n-type FET) external to design block D. Fast analysis tool 124 then stores the assumptions made during fast analysis of each ported signal net of design block D, as assumption information 130 in database 122, via data path 140. Analysis results 128 and assumption information 130 are made available for detailed analysis tool 126 when performing detailed analysis of circuit design 116'.

FIG. 8 is a block diagram illustrating exemplary data flow during detailed analysis of circuit design 116' by detailed analysis tool 126 utilizing fast analysis results 128 and assumption information 130. In one embodiment, detailed analysis tool 126 produces detailed analysis results 129 for each instance of selected design blocks A–D of circuit design 116'. Detailed analysis tool 126 may utilize fast analysis results 128 to produce detailed analysis results 129. Detailed analysis tool 126 stores detailed analysis results 129 in database 122 via data path 156; it may also output detailed analysis results 129, for example to a printing device or other functionality of system 100, FIG. 3, via data path 150. In one example, detailed analysis tool 126 analyzes circuit design 116' to determine FET leakage current utilizing fast analysis results 128 and assumption information 130.

More particularly, during detailed analysis of circuit design 116', detailed analysis tool 126 reads instantiation characteristics 134, via data path 148, to determine block instances (e.g., A1, B1, C1, C2, etc.) for each selected design block (e.g., A, B, C and D). For each block instance, detailed analysis tool 126 determines if fast analysis results 128 are usable during the detailed analysis. For example, during detailed analysis of block instances C1 and C2, detailed analysis tool 126 reads assumption information of design block C from assumption information 130, via data path 154. If assumption information 130 for ported signal nets of design block C does not match actual signal net connections of block instance C1, fast analysis results 128 for design block C are not usable during detailed analysis of block instance C1 by detailed analysis tool 126. Detailed analysis tool 126 therefore performs a hierarchical detailed analysis of block instance C1, for example by following ported signal nets into adjacent block instances to generate detailed analysis results 129. If assumption information 130 for ported signal nets of design block C does match actual signal net connections of block instance C1, detailed analysis tool 126 utilizes fast analysis results 128 for design block C (from database 122, via data path 152), to determine detailed analysis results 129.

As appreciated by those of ordinary skill in the art, each design block may have many instantiations within circuit design 116'; therefore use of fast analysis results 128 during detailed analysis of circuit design 116' reduces processing time of detailed analysis tool 126.

Figure 9:
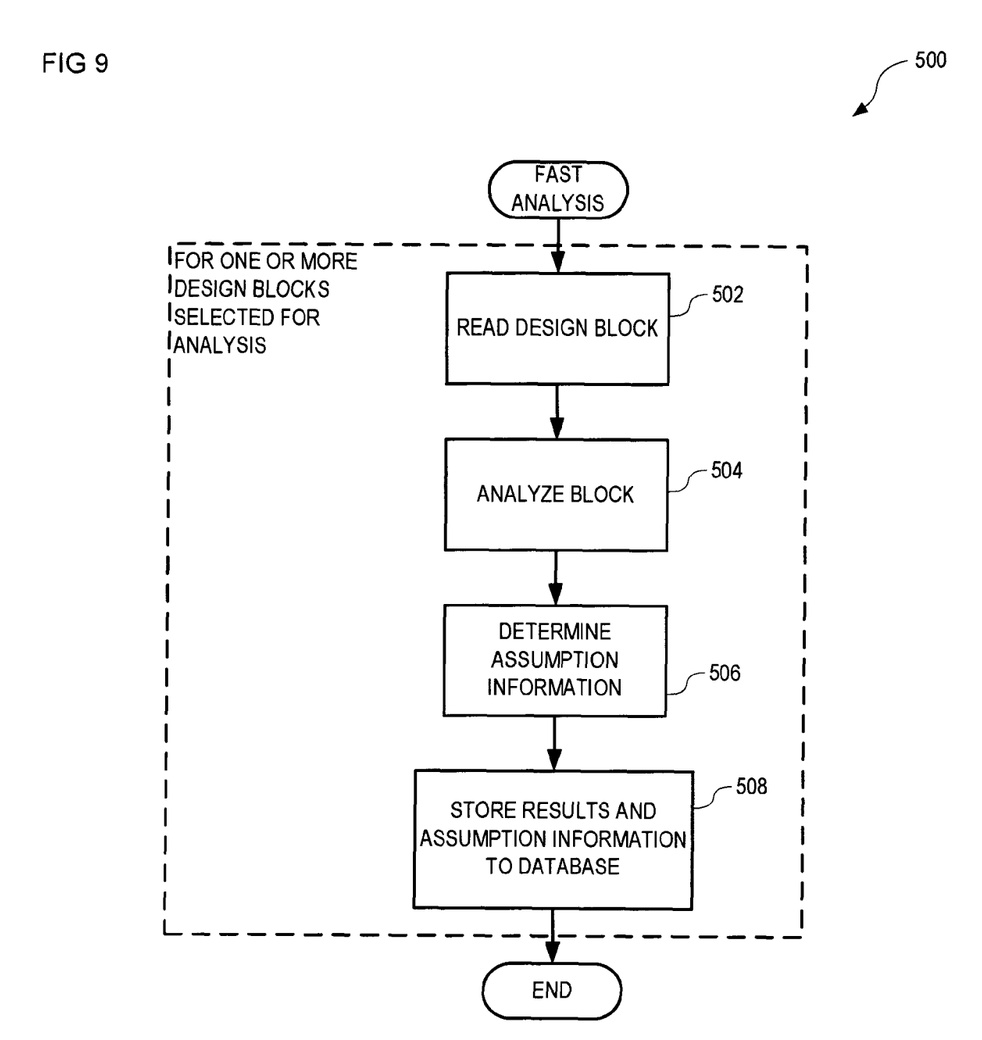
FIG. 9 is a flowchart illustrating one process of generating fast analysis information.

FIG. 9 is a flow chart illustrating one process 500 for analyzing a circuit design (e.g., circuit design 116') to produce fast analysis results 128 and assumption information 130. Process 500 is, for example, implemented by fast analysis tool 124. In step 502, process 500 reads a design block (e.g., design block A, FIG. 4) from circuit design 116'. In step 504, process 500 analyzes the design block to generate a fast analysis result. For example, step 504 may analyze the design block to determine FET leakage current for all FETs in the design block. In step 506, process 500 determines assumptions made during analysis of the design block. In step 508, process 500 stores fast analysis results (determined in step 504) as fast analysis results 128 and stores assumptions (determined in step 506) as assumption information 130. Steps 502 through 508 repeat as necessary to process other selected blocks of circuit design 116'.

Fast analysis of a circuit design provides analysis results for selected design blocks by making assumptions as to connectivity of ported signal nets within each design block. These assumptions increase the speed of fast analysis tool 124 such that results are quickly delivered to a requesting design engineer. By storing fast analysis results 128 and assumption information 130 in database 122, detail analysis tool 126 has access to the data during later detailed analysis of circuit design 116'.

Figure 10:
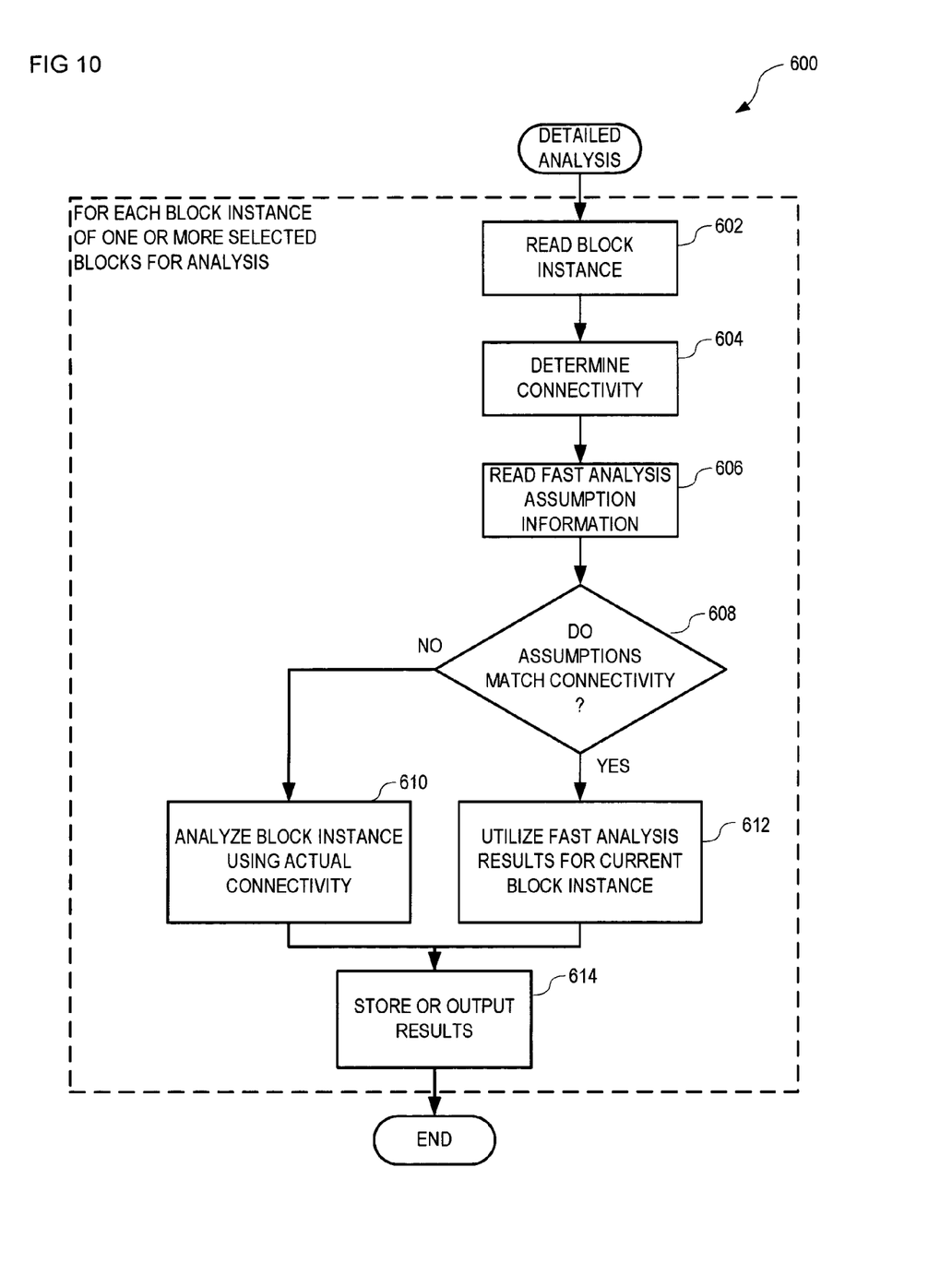
FIG. 10 is a flowchart illustrating one process of utilizing fast analysis information during detailed analysis of a circuit design.

FIG. 10 is a flowchart illustrating one process 600 for analyzing a circuit design (e.g., circuit design 116') to produce detailed analysis results 129. Process 600 is, for example, implemented by detailed analysis tool 126 of system 100. In step 602, process 600 reads a block instance (e.g., block instance D(1), FIG. 2) from the circuit design, such as by reading instantiation characteristics 134 of netlist 118. In step 604, process 600 determines connectivity of signal nets within the block instance read in step 602 by tracing the signal nets through the hierarchical circuit design. For example, during analysis of block instance D(1), FIG. 2, signal net 22(1) is followed, through block instance C(1) where it connects to signal net 38(1), into block instance D(2) where signal net 38(1) connects to signal net 20(2). In step 606, process 600 reads assumptions relating to a design block (e.g., design block A) of the block instance (e.g., block instance A1) read in step 602 from assumption information 130.

Step 608 is a decision. If the assumptions read in step 606 match the connectivity determined in step 604, process 600 continues with step 612; otherwise process 600 continues with step 610. Using the example of FIG. 2, during fast analysis of design block D, FIG. 1, fast analysis tool 124 assumes that signal net 22(1) is connected to another signal net and not as power net. Following signal net 22(1) through block instances C(1) and D(2), detailed analysis tool determines that this assumption is correct, and therefore fast analysis results can be used by continuing with step 612 of process 600. In step 610, process 600 performs a detailed analysis of the block instance, recursively following signal nets of the block instance to determine detailed analysis results (e.g., detailed analysis results 129). In step 610, process 600 is unable to use fast analysis results 128, and therefore performs a recursive hierarchical analysis of signal nets of the block instance.

In step 612, process 600 utilizes fast analysis results for the design block from which the block instance (read in step 602) was derived to determine detailed analysis results 129. For example, if the assumptions made during the fast analysis of design block D (read in step 606) match the actual connectivity of block instance D(1) (determined in step 604), process 600 may use fast analysis results 128 in determining detailed analysis results 129, thereby reducing processing time required by process 600.

In step 614, process 600 outputs data, for example storing or printing detailed analysis results determined in either step 610 or step 612. In one example, process 600 stores detailed analysis results determined in step 610 or step 612 in detailed analysis results 129 of database 122, and optionally outputs these results via data path 150, FIG. 8.

Detailed analysis of a circuit design (e.g., circuit design 116) by detail analysis tool 126 is an involved and lengthy process. To determine characteristics (e.g., FET leakage currents) for a signal net, the signal net is traced and analyzed through each block instances in the design. By utilizing fast analysis results 128 during detailed analysis, where assumptions made during the fast analysis match the actual connectivity of the signal net, processing time is reduced, expediting delivery of the detailed analysis results to the design engineer.

Figure 11:
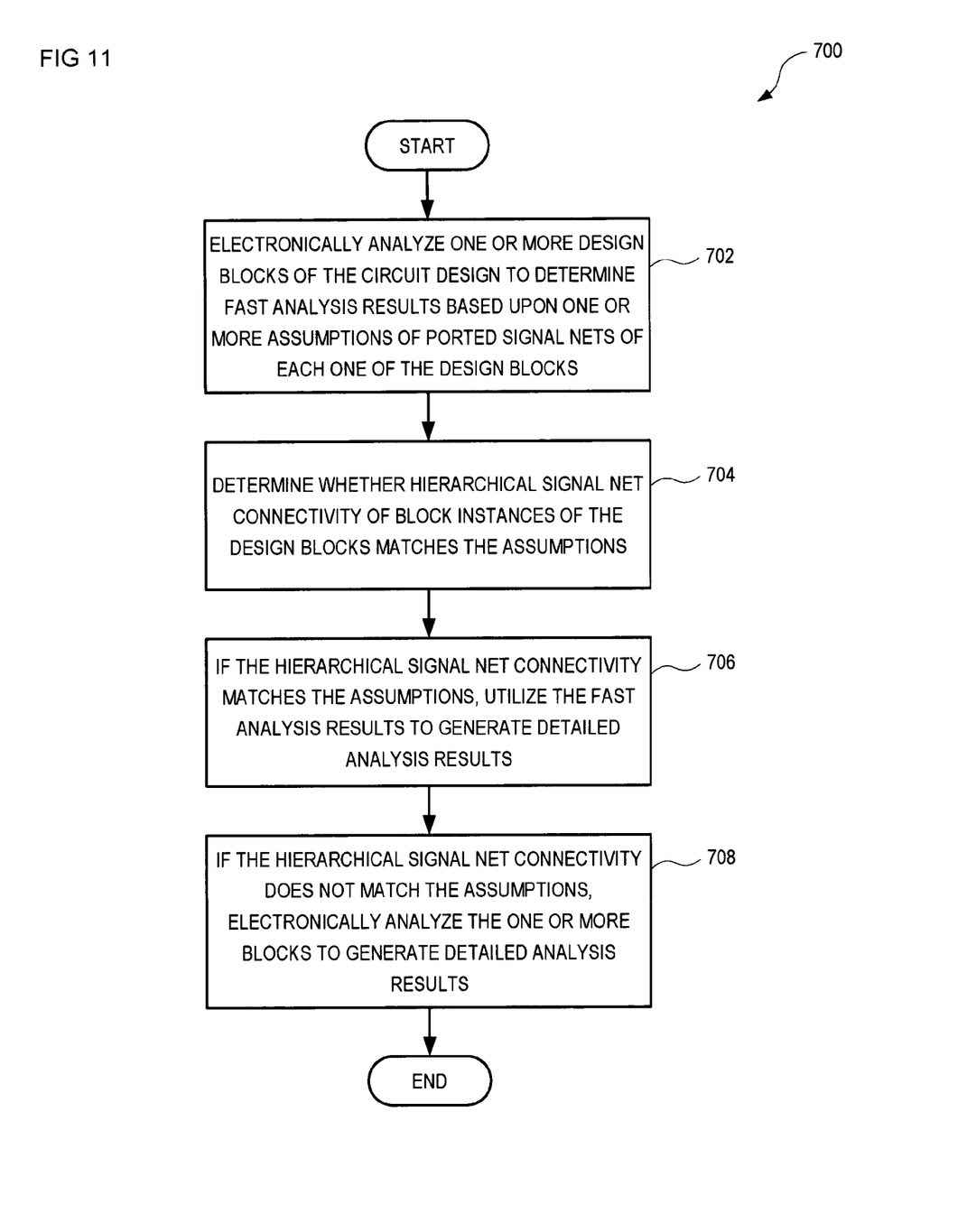
FIG. 11 shows one process for utilizing fast analysis information during detailed analysis of a circuit design.

FIG. 11 is a flowchart illustrating one process 700 for utilizing fast analysis information during detailed analysis of a circuit design. Process 700 is for example implemented by fast analysis tool 124 and detailed analysis tool 126 of FIG. 1. In step 702, one or more design blocks of the circuit design are electronically analyzed to determine fast analysis results based upon one or more assumptions of ported signal nets of each one of the design blocks. In step 704, it is determined whether hierarchical signal net connectivity of block instances of the design blocks matches the assumptions. In step 706, if the hierarchical signal net connectivity matches the assumptions, the fast analysis results are utilized to generate detailed analysis results. In step 708, if the hierarchical signal net connectivity does not match the assumptions, the one or more blocks are electronically analyzed to generate detailed analysis results.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for utilizing fast analysis information during detailed analysis of a circuit design, comprising:
   electronically analyzing one or more design blocks of the circuit design to determine fast analysis results based upon one or more assumptions of ported signal nets of each one of the design blocks;
   determining whether hierarchical signal net connectivity of block instances of the design blocks matches the assumptions;
   if the hierarchical signal net connectivity matches the assumptions, utilizing the fast analysis results to generate detailed analysis results; and if the hierarchical signal net connectivity does not match the assumptions, electronically analyzing the one or more blocks to generate detailed analysis results.

2. The method of claim 1, the fast analysis results and detailed analysis results comprising FET leakage current.

3. The method of claim 1, wherein the assumptions specify that the ported signal nets do not connect to power nets.

4. The method of claim 1, wherein the assumptions specify that a ported signal net connected to a first FET within a design block also connects to a signal net connected to a second FET external to the design block, wherein the second FET is of the opposite type to the first FET.

5. The method of claim 1, further comprising generating assumption information defining which assumptions were utilized in determining the fast analysis results.

6. The method of claim 1, further comprising reading instantiation characteristics to determine the block instances.

7. A system for utilizing fast analysis information during detailed analysis of a circuit design, comprising:
   a fast analysis tool for electronically analyzing one or more design blocks of the circuit design to determine fast analysis results based upon assumptions of ported signal nets of each one of the design blocks; and
   a detailed analysis tool for determining whether hierarchical signal net connectivity of block instances of the design blocks matches the assumptions, the detailed analysis tool utilizing the fast analysis results to generate detailed analysis results when the hierarchical connectivity matches the assumptions and electronically analyzing instances of the one or more blocks to generate detailed analysis results when the hierarchical connectivity does not match the assumptions.

8. The system of claim 7, the fast analysis results and detailed analysis results comprising FET leakage current.

9. The system of claim 7, the assumptions specifying that the ported signal nets do not connect to power nets.

10. The system of claim 7, the assumptions specifying that a ported signal net connected to a first FET within a design block also connects to a signal net connected to a second FET external to the design block, wherein the second FET is of the opposite type to the first FET.

11. The system of claim 7, the fast analysis tool generating assumption information defining which assumptions were utilized in determining the fast analysis results.

12. The system of claim 7, the detailed analysis tool reading instantiation characteristics to determine the block instances.

13. The system of claim 7, further comprising a database for storing the fast analysis results for access by the detailed analysis tool.

14. The system of claim 13, the database storing the assumptions.

15. The system of claim 14, the database storing the detailed analysis results.

16. A system for utilizing fast analysis information during detailed analysis of a circuit design, comprising:
   means for electronically analyzing one or more design blocks of the circuit design to determine fast analysis results based upon assumptions of ported signal nets of each one of the design blocks;
   means for determining whether hierarchical signal net connectivity of block instances of the design blocks matches the assumptions;
   means for utilizing the fast analysis results to generate detailed analysis results when the hierarchical signal net connectivity matches the assumptions; and
   means for electronically analyzing the one or more blocks to generate detailed analysis results when the hierarchical signal net connectivity does not match the assumptions.

17. A software product comprising instructions, stored on computer-readable media, wherein the instructions, when executed by a computer, perform steps for utilizing fast analysis information during detailed analysis of a circuit design, comprising:
   instructions for electronically analyzing one or more design blocks of the circuit design to determine fast analysis results based upon assumptions of ported signal nets of each one of the design blocks;
   instructions for determining whether hierarchical signal net connectivity of block instances of the design blocks matches the assumptions;
   instructions for utilizing the fast analysis results to generate detailed analysis results when the hierarchical signal net connectivity matches the assumptions; and
   instructions for electronically analyzing the one or more blocks to generate detailed analysis results when the hierarchical signal net connectivity does not match the assumptions.

18. The software product of claim 17, wherein the assumptions specify that (a) the ported signal nets do not connect to power nets and (b) a ported signal net connected to a first FET within a design block also connects to a signal net connected to a second FET external to the design block, wherein the second FET is of the opposite type to the first FET.

19. The software product of claim 17, further comprising instructions for generating assumption information defining which assumptions were utilized in determining the fast analysis results.

20. The software product of claim 17, further comprising instructions for reading instantiation characteristics to determine the block instances.

* * * * *